US006727694B2

United States Patent
Doescher

(10) Patent No.: US 6,727,694 B2
(45) Date of Patent: Apr. 27, 2004

(54) MR ANGLE SENSOR

(75) Inventor: Michael Doescher, Hamburg (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 18 days.

(21) Appl. No.: 09/817,110

(22) Filed: Mar. 26, 2001

(65) Prior Publication Data

US 2001/0038286 A1 Nov. 8, 2001

(30) Foreign Application Priority Data

Mar. 27, 2000 (DE) .......................... 100 14 780

(51) Int. Cl.[7] .................. G01R 33/02; G11B 5/127
(52) U.S. Cl. ................................ 324/252; 360/327
(58) Field of Search ................ 324/252, 207.21, 324/117 R; 338/32 R; 360/325, 327

(56) References Cited

U.S. PATENT DOCUMENTS

| 5,602,471 | A | * | 2/1997 | Muth et al. | 324/207.21 |
|---|---|---|---|---|---|
| 5,650,721 | A | * | 7/1997 | van den Berg et al. | 324/207.21 |
| 5,689,185 | A | * | 11/1997 | Widdershoven et al. | 324/252 |
| 6,259,586 | B1 | * | 7/2001 | Gill | 360/324.2 |
| 6,433,537 | B1 | * | 8/2002 | Petersen | 324/207.24 |

* cited by examiner

Primary Examiner—John Barlow
Assistant Examiner—Toan M Le
(74) Attorney, Agent, or Firm—Aaron Waxler

(57) ABSTRACT

Magnetoresistive sensors for angle measurements such as, for example, the sensors of the type KMZ 41, manufactured and marketed by Philips Semiconductors, utilize the effect that a sufficiently strong, external magnetic field H rotates the internal magnetization M in a parallel direction. In the case of said sensor KMZ 41, the magnetic field strength required for full alignment of the internal magnetization is 70 to 100 kA/m.

Figure 1:
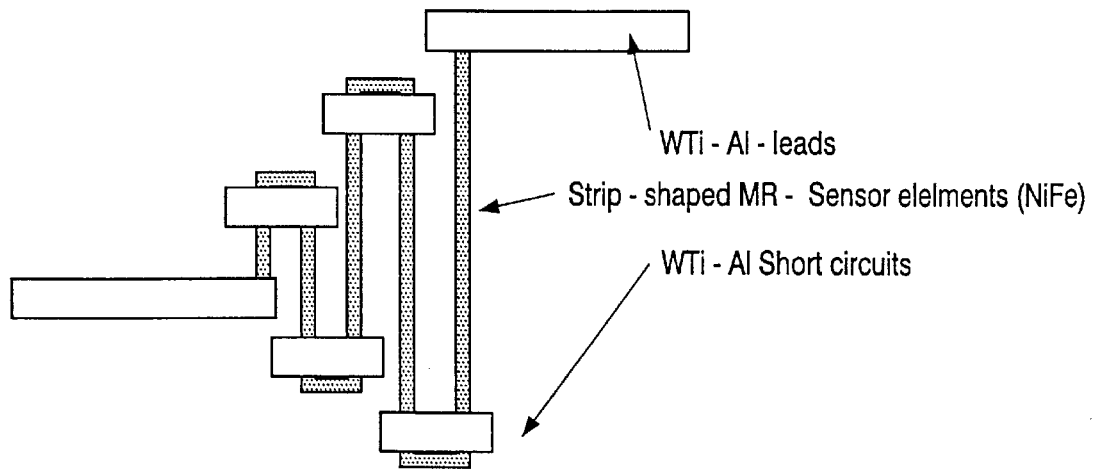

A reduction of this high field strength is desirable and may be achieved by increasing the tendency of the internal magnetization to change its direction. An increase of the tendency of the internal magnetization to change its alignment is achieved in accordance with the invention by using a trigger structure and strip-shaped sensor elements of NiFe material which have elliptic contours or tapered ends.

The trigger structure has a circular surface of NiFe material which is not electrically contacted. The internal magnetization of a circular surface may be rotated very easily, i.e. by weak magnetic fields. Via an electrostatic interaction, the tendency of a small rotation of the magnetization can be transferred to adjacent MR strips (i.e. sensor elements) of NiFe material, for which purpose these MR strips must be arranged closely adjacent to each other. A reduction of the magnetic field strength required for a saturation, i.e. full alignment, to 20 to 30 kA/m is thereby possible.

6 Claims, 1 Drawing Sheet

MR ANGLE SENSOR

The invention relates to magnetoresistive sensors for angle measurements. A preferred field of application of magnetoresistive sensors is their use for contactless angle measurement.

Magnetoresistive sensors for angle measurements such as, for example, the sensors of the type KMZ 41, manufactured and marketed by Philips Semiconductors, are principally known and utilize the magnetoresistive effect. A preferred use of MR sensors is in the weak field, angle and rotation measurements and in Magnetic Force Microscopy measurements (abbreviated MFM measurements; for example, on crystals of the product marketed as KMZB34 by Philips Semiconductors).

Magnetoresistive sensors (also abbreviated to and known as MR sensors) for angle measurements operate in the saturation range, i.e. they utilize the effect that a sufficiently strong external magnetic field H rotates an internal magnetization M of the sensor elements in the arrangement of the magnetoresistive sensor in a (substantially) fully parallel direction. In the case of said sensor KMZ 41, the magnetic field strength of the external magnetic field required for full alignment of the internal magnetization is 70 to 100 kA/m. The generation of such a strong magnetic field requires a relatively high number of constructive components. A reduction of this high field strength is desirable.

It is an object of the invention to achieve a decrease of the magnetic field strength required for saturation (parallel setting).

To achieve this object, an easier rotatability of the magnetization of the MR sensor elements must be obtained. According to the invention, this is achieved by a magnetic field-sensitive sensor arrangement comprising a sensor element of NiFe material which is substantially arranged in a plane and is substantially strip-shaped in this plane, said material having an at least substantially elliptical and/or tapering contour at its ends in this plane, and a substantially circular trigger element of NiFe material which is arranged in said plane adjacent to at least one of the strip-shaped sensor elements and is insulated therefrom. Particularly, the trigger structure comprising the substantially circular, electrically uncontacted trigger element of NiFe material contributes to achieving the object.

The rotatability of the magnetization may be fundamentally increased, on the one hand, by way of the design of the MR sensor elements and, on the other hand, by realization of the circular trigger structure. Due to its circular shape, the trigger structure provides the principally easiest rotatability of the magnetization; this rotation can thus be effected by weak magnetic fields. It is therefore obvious to realize the sensor elements also in a circular shape. However, this has the drawback that-conditioned by manufacturing spreads (mask adjustment in photolithography, etc.)-such circular structures can only be contacted very incompletely, i.e. with inadmisibly high manufacturing tolerances, and, moreover, require a large surface area.

The invention is therefore useful to the extent that a circular structure which is not electrically connected to the rest of the sensor elements does not only have the very satisfactory rotatability of the magnetization but also transfers this rotatability to the adjacent MR sensor elements due to electrostatic interaction. In other words, the invention utilizes the electrostatic interaction of sensor elements which are arranged spatially close together, with a resultant influence of the direction of magnetization (i.e. the domain structure of the NiFe material). When the lateral distance between the trigger structure, i.e. the substantially circular trigger element of NiFe material, and the subsequent MR sensor elements is sufficiently small—it should be as small as is constructively possible—, then there is an electrostatic influence on the trigger structure and the sensor elements, which significantly enhances the rotatability of the magnetization in the adjacent sensor elements, namely by a reduction of the shape-anisotropy field strength. When the distance between subsequent MR sensor elements is also small at the most adjacent location, i.e. when it is preferably approximately the same as the distance between the trigger structure and the first MR sensor element, and when the separate sensor elements have a length whose value, starting from that of the sensor element which is directly adjacent to the trigger structure, i.e. the substantially circular trigger element of NiFe material, increases continuously from sensor element to sensor element, the easy rotatability of the magnetization of the substantially circular trigger element of NiFe material is transferred to the whole sensor, i.e. the overall arrangement of sensor elements.

The invention has the advantage that the magnetic field strength of the external magnetic field (also denoted as "saturation field strength") required for full alignment of the internal magnetization can be realized with simple, constructive means and that, for example, a reduction of the required saturation field strength to 20–30 kA/m can be achieved for the magnetoresistive sensors of the types described in the opening paragraph. The invention has the further advantage that this effect is not influenced by manufacturing spreads.

These and other aspects of the invention are apparent from and will be elucidated with reference to the embodiments described hereinafter.

Figure 2:
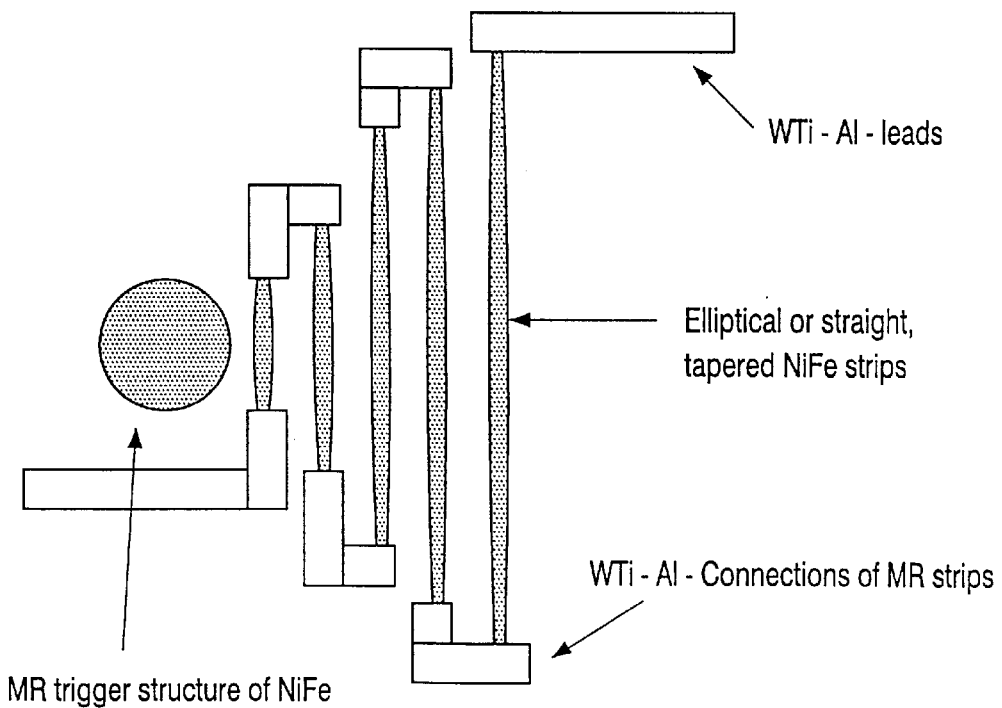

In the drawings:

FIG. 1 shows diagrammatically a magnetic field-sensitive sensor arrangement with at least one sensor element of NiFe material arranged substantially in a plane and being substantially strip-shaped in this plane, FIG. 2 shows diagrammatically an arrangement of a magnetic field-sensitive sensor arrangement according to the invention.

The magnetic field-sensitive sensor arrangement of FIG. 1 is shown diagrammatically in a plan view and comprises a plurality of sensor elements of NiFe material (strip-shaped M sensor elements (NiFe)) which are arranged substantially in a plane and are substantially strip-shaped in this plane, which sensor elements are arranged at least substantially parallel to each other. The separate sensor elements have a length whose value, starting from that of the sensor element arranged at the extreme left in FIG. 1, increases continuously from sensor element to sensor element. The sensor elements are preferably arranged spatially close together, i.e. closely adjacent. They are electrically connected by means of a meander-like connection of the sensor elements, such that respective adjacent ends of two respective adjacent sensor elements are connected by means of electrically conducting connection elements (WTi—Al short circuits). A lead (WTi—Al lead) for contacting the magnetic field-sensitive sensor arrangement is passed to the exterior from each end of the first and the last sensor element in the row, i.e. in FIG. 1 the lower end of the shortest sensor element arranged at the extreme left, and the upper end of the longest sensor element arranged at the extreme right.

FIG. 2 shows an embodiment of a magnetic field-sensitive sensor arrangement according to the invention in a diagrammatic plan view. This magnetic field-sensitive sensor arrangement has a plurality of sensor elements of NiFe material (strip-shaped MR sensor elements (NiFe)) arranged substantially in a plane and being substantially strip-shaped in this plane, which sensor elements, in contrast to the magnetic field-sensitive sensor arrangement of FIG. 1, have a contour which is at least substantially elliptical and/or tapered at their ends (elliptical or straight, tapered NiFe strips). This magnetic field-sensitive sensor arrangement also comprises an essentially circular trigger element of NiFe material (MR trigger structure of NiFe) arranged in said plane adjacent to, and insulated from, at least one of the strip-shaped sensor elements. Similarly as in the magnetic field-sensitive sensor arrangement of FIG. 1, the substantially strip-shaped sensor elements are arranged at least substantially parallel to each other. The separate sensor elements have a length whose value, starting from that of the sensor element directly adjacent to the substantially circular trigger element of NiFe material, increases continuously from sensor element to sensor element. The arrangement of the trigger element (MR trigger structure of NiFe) is chosen to be arranged concentrically beside the sensor elements (elliptical or straight, tapered NiFe strips) as regards the longitudinal extension of these sensor elements. These sensor elements are arranged spatially close together, i.e. closely adjacent and connected together to form a conducting structure by means of a meander-like connection of the sensor elements, such that the respective adjacent ends of two respective adjacent sensor elements are connected by means of electrically conducting connection elements (WTi—Al connections of the MR strips) to form a conducting structure. A lead (WTi—Al lead) for contacting the magnetic field-sensitive sensor arrangement is passed to the exterior from one of the ends of the first and the last sensor elements in the row, i.e. in FIG. 2, the lower end of the shortest sensor element arranged at the extreme left, and the upper end of the longest sensor element arranged at the extreme right.

What is claimed is:

1. A magnetic field-sensitive sensor arrangement comprising a sensor element of NiFe material which is substantially arranged in a plane and is substantially strip-shaped in this plane, said material having an at least substantially elliptical and/or tapering contour at its ends in this plane, and a substantially circular trigger element of NiFe material which is arranged in said plane adjacent to at least one of the strip-shaped sensor elements and is insulated therefrom.

2. A magnetic field-sensitive sensor arrangement as claimed in claim 1, comprising at least two substantially strip-shaped sensor elements, characterized in that the substantially strip-shaped sensor elements are arranged at least substantially parallel to each other.

3. A magnetic field-sensitive sensor arrangement as claimed in claim 2, characterized in that the separate sensor elements have a length whose value, starting from that of the sensor element directly adjacent to the substantially circular trigger element of NiFe material, continuously increases from sensor element to sensor element.

4. A magnetic field-sensitive sensor arrangement as claimed in claim 2, characterized by an arrangement of the trigger elements concentrically beside the sensor elements as regards the longitudinal extension of said sensor elements.

5. A magnetic field-sensitive sensor arrangement as claimed in claim 2, characterized in that the sensor elements are arranged spatially close together, i.e. arranged closely adjacent to each other.

6. A magnetic field-sensitive sensor arrangement as claimed in claim 2, characterized by a meander-like connection of the sensor elements, such that the respective adjacent ends of two respective adjacent sensor elements are connected by means of electrically conducting connection elements.

* * * * *